(12) United States Patent
Yuli et al.

(10) Patent No.: US 10,943,763 B1
(45) Date of Patent: Mar. 9, 2021

(54) USE OF ELECTRON BEAM SCANNING ELECTRON MICROSCOPY FOR CHARACTERIZATION OF A SIDEWALL OCCLUDED FROM LINE-OF-SIGHT OF THE ELECTRON BEAM

(71) Applicant: Applied Materials, Inc., Santa Clara, CA (US)

(72) Inventors: Ofer Yuli, Sunnyvale, CA (US); Samer Banna, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/580,325

(22) Filed: Sep. 24, 2019

(51) Int. Cl.
*H01J 37/22* (2006.01)
*H01J 37/28* (2006.01)

(52) U.S. Cl.
CPC ............ *H01J 37/222* (2013.01); *H01J 37/28* (2013.01); *H01J 2237/221* (2013.01); *H01J 2237/2448* (2013.01); *H01J 2237/2806* (2013.01); *H01J 2237/2814* (2013.01)

(58) Field of Classification Search
CPC ...................... H01J 37/244; H01J 37/28; H01J 2237/24578; H01J 2237/281; H01J 2237/24475; H01J 2237/24592; H01J 2237/2815; H01J 2237/2817; H01J 2237/221; H01J 2237/2448; H01J 2237/24495; H01J 2237/2441; H01J 2237/2449; H01J 2237/2806; H01J 2237/2826; H01J 2237/334; H01J 37/22; H01J 37/256; H01J 37/261; H01J 37/29

USPC .......... 250/306, 307, 310, 370.14, 394, 395
See application file for complete search history.

(56) References Cited

U.S. PATENT DOCUMENTS

| | | | | |
|---|---|---|---|---|
| 6,472,662 | B1* | 10/2002 | Archie | G01N 23/225 250/306 |
| 9,530,674 | B2* | 12/2016 | Yieh | C23C 16/50 |
| 2012/0104254 | A1* | 5/2012 | Shishido | H01J 37/244 250/310 |
| 2013/0270439 | A1* | 10/2013 | Adamec | H01J 37/244 250/310 |
| 2014/0001357 | A1* | 1/2014 | Graupera | H01J 37/28 250/307 |
| 2016/0379798 | A1* | 12/2016 | Shishido | H01J 37/244 250/307 |
| 2019/0148108 | A1* | 5/2019 | Sun | H01J 37/244 250/307 |
| 2019/0362933 | A1* | 11/2019 | Takagi | H01J 37/28 |

* cited by examiner

*Primary Examiner* — David A Vanore
(74) *Attorney, Agent, or Firm* — Lowenstein Sandler LLP

(57) ABSTRACT

A semiconductor device is scanned by an electron beam of a scanning electron microscope (SEM). The area includes a three-dimensional (3D) feature having a top opening and a sidewall. The 3D feature is imaged while varying an energy value of the electron beam. The electron beam impinges at a first point within a selected area of the semiconductor device and interacts with the sidewall, wherein the first point is at a distance away from an edge of the top opening. Based on change in a signal representing secondary electron yield at the edge as the energy value of the electron beam is varied during the SEM imaging, it is determined whether the sidewall is occluded from a line-of-sight of the electron beam. A slope of the sidewall may be determined by comparing measured signals with simulated waveforms corresponding to various slopes.

20 Claims, 9 Drawing Sheets

USE OF ELECTRON BEAM SCANNING ELECTRON MICROSCOPY FOR CHARACTERIZATION OF A SIDEWALL OCCLUDED FROM LINE-OF-SIGHT OF THE ELECTRON BEAM

TECHNICAL FIELD

Embodiments of the disclosure relate generally to imaging of fine features in a device on a semiconductor wafer using precision three-dimensional profiles derived from scanning electron microscopy (SEM), and particularly to imaging fine features with sidewalls blocked from an electron beam of the SEM.

BACKGROUND

The manufacturing process of semiconductor integrated circuits requires high resolution measurements of fine features for accurate metrology. Profiles of three-dimensional (3D) features with various sidewall angles need to be accurately characterized along the longitudinal direction (z-axis) for effective process optimization and control. So far, full profile characterization has been done mainly by destructive imaging techniques like inspecting longitudinal sections under Scanning Electron Microscope (x-SEM) or Transmission Electron Microscope (TEM). The longitudinal sections may be prepared by using Focused Ion Beam (FIB) or other tools. Inspecting longitudinal sections may be useful for accurately revealing the real 3D profile of shallow or deep features by combining multiple 2D profiles in the longitudinal plane, but the information gathered is limited to small regions (generating very low statistics) on the wafer and sample preparation can be time consuming. Moreover, the measurement is prone to variability due to the semi-manual sample preparation. Alternative techniques based on diffraction imaging (e.g., Critical Dimension Small Angle X-ray Scatterometry (CDSAXS)) are limited to average information of large areas and require complex data analysis that usually requires prior knowledge of the actual structure. So diffraction imaging is not suitable 3D profiling of fine features that require high accuracy.

Here a method is proposed for obtaining 3D profiles of semiconductor features using electron beam (e-beam) imaging, even when the feature has a sidewall which is hidden from the line-of-sight of the electron beam, i.e. the sidewall has a negative slope. The non-destructive nature of e-beam imaging allows profiling analysis to be done on a large scale (i.e., massive measurements), providing a statistical overview of the entire wafer. In addition, e-beam profiling can be used in-line without destroying the wafer to get access to longitudinal cross-section, as done conventionally in x-SEM and TEM. This non-destructive approach improves the throughput and optimizes cost as it is feasible to integrate with the rest of wafer processing steps in a production line.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

The technique disclosed here obtains a series of SEM images at various energy values for a primary electron beam (which may be a focused e-beam interacting with a limited area of the semiconductor device that includes the 3D feature) that impinges at a point on the wafer that is away from an edge of a feature. The feature has a sidewall and a top opening. With increasing beam energy, secondary electrons emerge from deeper portions of the sidewall of the feature. However, if the sidewall is occluded from the line-of-sight of the primary electron beam, then the secondary electron yield diminishes and a measured signal weakens. This weakening can be countered by charging the selected area of the semiconductor device around the 3D feature. Analyzing the change of signal at the edge of the feature, a slope of the sidewall can be calculated. The calculated slopes at various depths can then be used to reconstruct a composite 3D profile of the feature.

Specifically, aspects of the disclosure describe a method and a corresponding system for: selecting an area of a semiconductor device to be scanned by an electron beam of a scanning electron microscope (SEM), wherein the area includes a three-dimensional (3D) feature having a top opening and a sidewall; imaging the 3D feature while varying an energy value of the electron beam, wherein the electron beam impinges at a first point within the selected area of the semiconductor device and interacts with the sidewall, wherein the first point is at a distance away from an edge of the top opening; and, determining, based on change in a signal representing secondary electron yield at the edge as the energy value of the electron beam is varied during the SEM imaging, whether the sidewall is occluded from a line-of-sight of the electron beam.

Responsive to determining that the sidewall is occluded from the light-of-sight of the electron beam, a slope of the sidewall may be determined.

In another aspect of the disclosure, determining the slope of the sidewall may comprise: generating a plurality of waveforms by a model that simulates secondary electron yield during SEM imaging with the varying energy values of the electron beam, each waveform corresponding to a respective reference structure with a known negative slope; comparing the signal obtained during the SEM imaging with the waveforms generated by the model for the varying energy values; selecting the waveform that matches most closely with the signal obtained during the SEM imaging; and, determining that the negative slope associated with the selected waveform to be the slope of the sidewall of the 3D feature.

In another aspect, the disclosure describes charging the selected area of the semiconductor device to boost the signal obtained during the SEM imaging near the edge of the feature.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
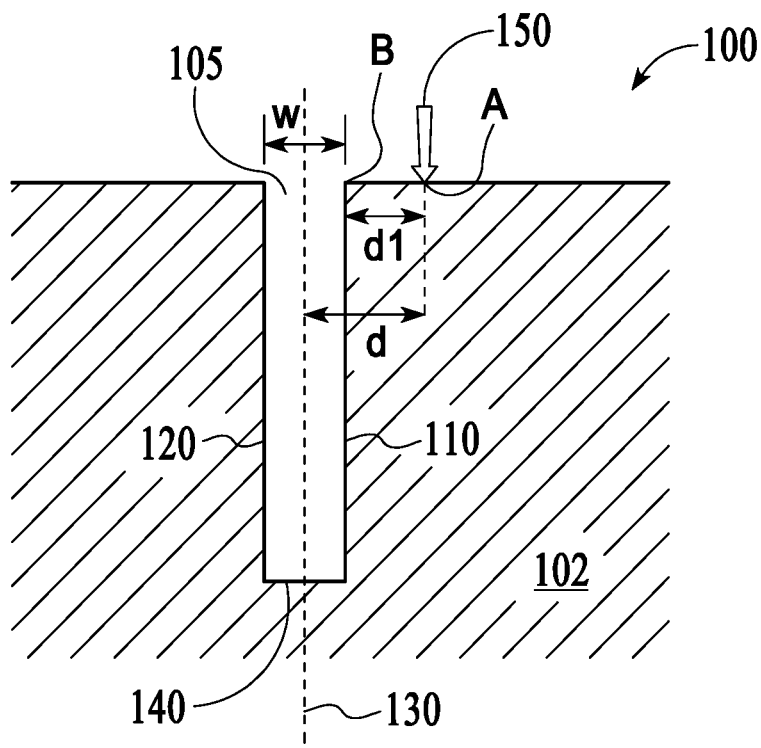
FIG. 1 illustrates a longitudinal sectional view of a 3D feature with perfectly vertical sidewalls, where the electron beam impinges at a distance away from the feature edge according to an embodiment of the present disclosure.

Embodiments of the present disclosure are directed to detection of existence of a 3D feature with a sidewall that has a negative slope (or a sidewall that is otherwise hidden from the line-of-sight of an electron beam). Once such a sidewall is detected, the slope of the sidewall is calculated comparing measured signals obtained from the 3D feature with waveforms simulated by a model using reference structures. Embodiments of the disclosure leverage interaction between the electron beam and the sidewall when the electron beam impinges at a finite distance away from an edge of the 3D feature with sufficient landing energy to penetrate through the body of the semiconductor device to generate secondary electrons from various depth points of the sloped sidewall. Knowing slope values at various depth points along the sloped sidewall helps in reconstructing the entire sidewall profile along the longitudinal direction without having to cut the wafer to expose the longitudinal section.

One objective of the disclosure is to construct 3D profiles of 3D features of interest in electronic devices in a non-destructive way using Scanning Electron Microscope (SEM) images obtained at different beam energy values. The electronic devices may be advanced semiconductor devices formed on a wafer. The 3D features may have a lateral dimension in a range varying from a few nanometers to tens or hundreds of nanometers. Some semiconductor devices may have fine features not only with tight lateral dimension, but also with high aspect ratio (HAR). For example, HAR features that are routinely used in current and next generation semiconductor devices, display devices, photovoltaic devices, micro-electro-mechanical systems (MEMS) devices, etc. usually have aspect ratio greater than 1:10, and more typically, in the range of 1:40 to 1:200. This disclosure is, however, not limited to any specific lateral dimension or any specific aspect ratio and is equally applicable for larger features and low and medium aspect ratio features as well. Illustrative examples of HAR features include, but are not limited to, channel holes, slits, trenches etc. Specific examples include circular memory holes in 3D NAND memory devices. Those skilled in the art can extrapolate the application of the disclosed technique to other geometries. Examples of other geometries include trenches such as those used for shallow trench isolation of transistors. The 3D features may be isolated structures or part of an array of similar features.

Irrespective of aspect ratio, 3D device features should be characterized well using detailed metrology to be able to tune process parameters, as a process (such as an etching process or a deposition process) progresses and the aspect ratio of the features changes. For example, in an etch process, the etch rate varies as the aspect ratio of a feature changes with time. Accurate characterization of device features enables effective tuning of the etch process parameters. Current approaches for device feature characterization use SEM images along a vertical (or longitudinal) section, and/or transmission electron microscopy (TEM) images. These destructive imaging techniques usually provide only an image of a single planar section from which a limited number of device characterization metrics are obtained, which is unsuitable for high-volume manufacturing (HVM). 3D features with negative slopes are particularly challenging to be imaged using non-destructive techniques because of the shadowing effect of the negatively sloped sidewalls, blocking secondary electrons.

The present disclosure addresses these and other shortcomings of the current methods by leveraging correlation between secondary electron yield with beam energy and distance from an edge of the 3D feature. Advantages of the current method include, but are not limited to: (1) non-destructive technique that can be easily integrated in the manufacturing process sequence; (2) cost-efficient; (3) full-wafer coverage of 3D profiling for low, medium and high aspect ratio features; (4) higher accuracy and automation of measurements.

Figure 2:
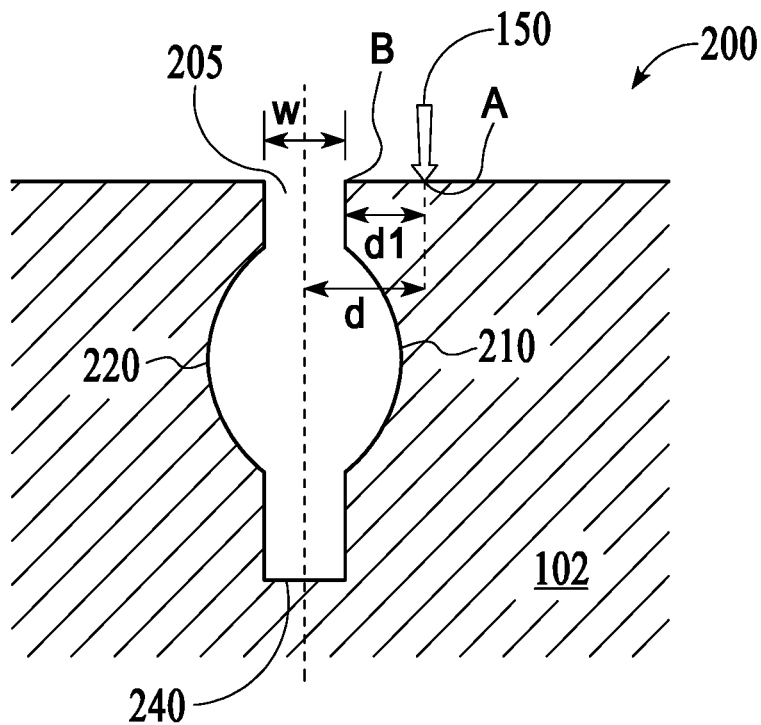
FIG. 2 illustrates a longitudinal sectional view of a 3D feature with sidewalls having a portion where the slope varies, according to an embodiment of the present disclosure.
Figure 3:
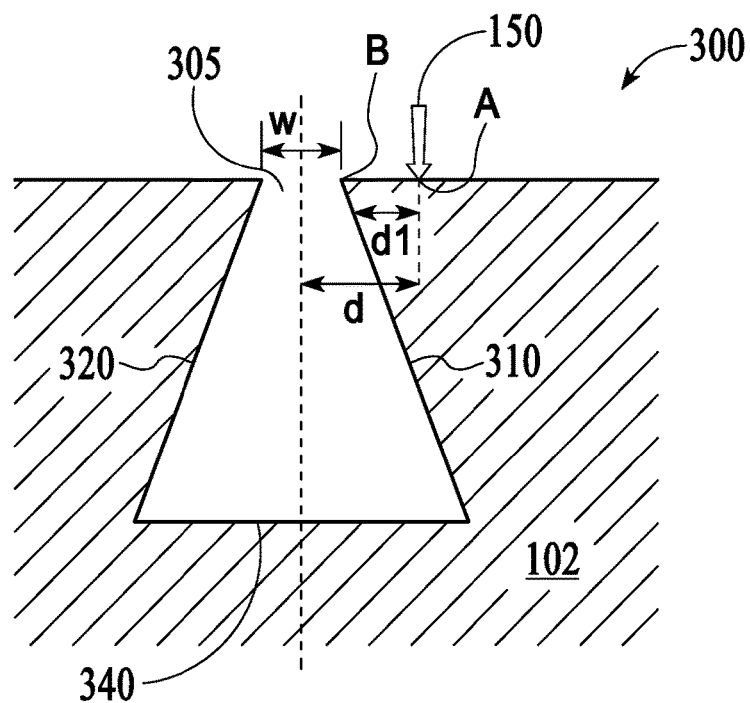
FIG. 3 illustrates a longitudinal sectional view of a 3D feature with sidewalls having a uniform negative slope, according to an embodiment of the present disclosure.

FIG. 1 illustrates a longitudinal sectional view of a 3D feature 100 in a device within a selected area of a semiconductor device that is scanned by a primary electron beam of a SEM apparatus. 3D feature 100 may be a recess or a hole within a solid portion 102 of the semiconductor device. 3D feature 100 comprises a top opening 105, sidewalls 110 and 120, and a bottom surface 140. Note that if the 3D feature is a cylindrical hole with a circular (or oval or elliptical) cross section, then sidewalls 110 and 120 would be part of a continuous surface. On the other hand, if the 3D feature has a polygonal cross sections, then the sidewalls 120 and 110 would be different surfaces. Ideally, both sidewalls 110 and 120 should have 0° slopes with respect to the light-of-sight of the electron beam (i.e., 90° slopes with respect to the wafer plane) such that the width 'w' at the top opening 105 should be the same as a width at the bottom surface 140. However, as FIGS. 2 and 3 show, due to process variation across a wafer, sidewalls may deviate from the ideal slope shown in FIG. 1. Additionally, although the 3D features in FIGS. 1-4 are shown to have symmetry with respect to the central axis (e.g., sidewalls 120 and 110 have equal slopes on both sides of the axis 130), in actual fabricated devices, slopes on different sidewalls on different sides of the axis may vary.

If the sidewalls have a positive slope, then the primary electron beam 150 may directly impinge on the sidewalls of the 3D feature and collect secondary electrons emerging from the sidewalls to characterize the 3D feature, including calculating the slope of the sidewalls. However, in actual fabricated devices, portions of the sidewalls (as shown in FIG. 2) or the entire sidewalls (as shown in FIG. 3) may be occluded from a line-of-sight of the primary electron beam 150, such that the primary electron beam 150 cannot directly reach the sidewalls. Present inventors have disclosed a technique where the primary electron beam 150 impinges at a point 'A' at a distance 'd' away from the center of the 3D feature (i.e., at a distance 'd1' from a point 'B' at the edge of the top opening 105, where dl=(d−0.5w)) on the top surface of the solid portion 102 of the semiconductor device, such that secondary electrons emitted from the sidewalls have an yield that is a function of the landing energy of the primary electron beam and the distance 'd1' from the edge. Note that the landing energy is also referred to simply as the "beam energy" or "primary beam energy" in this specification, where beam refers to a primary electron beam of the SEM.

FIG. 2 shows a longitudinal sectional view of a 3D feature 200 with a top opening 205 sidewalls 220 and 210, and a bottom surface 240. Sidewalls 220 and 210 do not have to have a single slope, and may have a curved portion with varying slopes, as shown. Primary electron beam 150 impinges at a point 'A' away from the edge 'B' and penetrates through the body 102 to interact with the curved sidewall 210.

FIG. 3 shows a longitudinal sectional view of a 3D feature 300 with a top opening 305 sidewalls 320 and 310, and a bottom surface 340. In this embodiment, sidewall 310 has a uniform negative slope when the primary electron beam impinges at point 'A' on the right side of the axis of the feature 300 and penetrates through the body 102 to interact with the sloped sidewall 310. Similarly, sidewall 320 has a uniform negative slope when the primary electron beam impinges on the left side of the axis and penetrates through the body 102 to interact with the sloped sidewall 320. Note slope of sidewall 310 and slope of sidewall 320 do not have to be the same.

Figure 4:
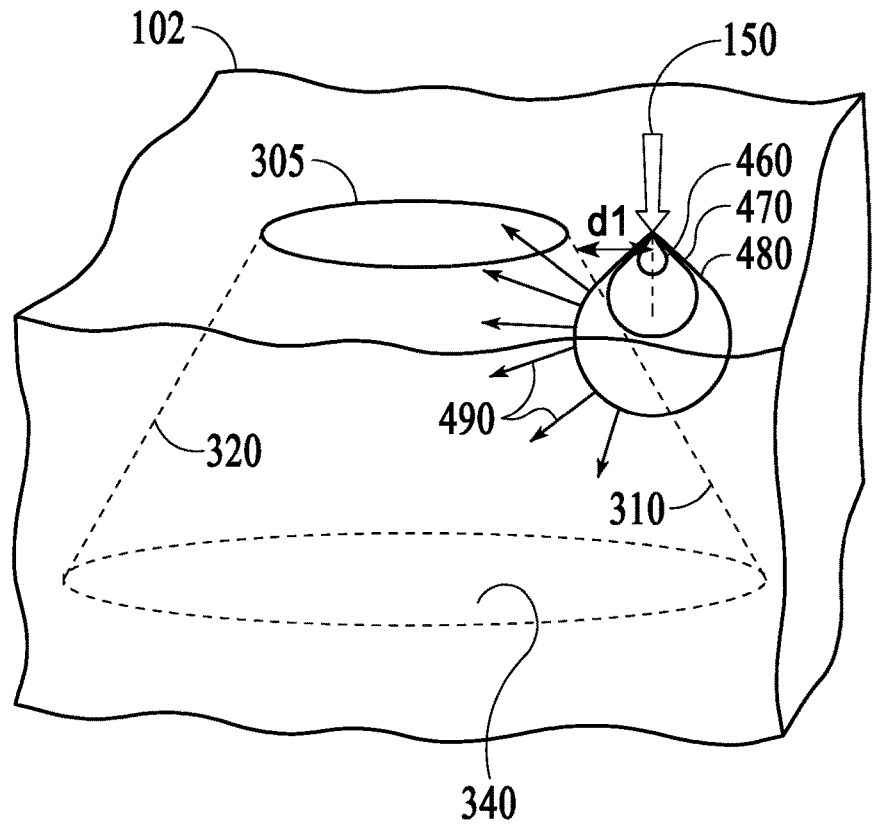
FIG. 4 illustrates interaction volumes for the SEM corresponding to increasing beam energy values, according to embodiments of the present disclosure.

FIG. 4 shows how the primary electron beam 150 interacts with the sloped sidewall 310. The interaction volume increases with landing energy (LE) of the primary electron beam 150. For example, if the primary beam impinges at a given distance from the edge, for a landing energy of 1 kV, the interaction volume 460 may not be large enough to interact with sidewall 310. For a landing energy of 3 kV, the interaction volume 470 may just be large enough to start interacting with sidewall 310, so that a small amount of secondary electrons starts emerging, which may be difficult to detect. For a landing energy of 5 kV, however, the interaction volume 480 interacts adequately with the sidewall 310 such that sufficient number of secondary electrons 490 are emerged to produce a detectable yield.

Landing energy determines the penetration depth of the primary electron beam for a given distance. Profiling of the sidewall is achieved by monitoring a signal representing secondary electron yield at the edge of the 3D feature as the landing energy sweeps between a lower value and an upper value continuously or in steps. The signal is inherently a function of landing energy and the distance of the beam from the edge of the feature (e.g., the distance 'd1' between the points 'B' and 'A'). Landing energy required to create a sufficiently large interaction volume to reach a certain depth depends on the distance of beam impingement point from the edge of the feature. Calculated local slope values at various depth points along the sidewall are used in reconstructing the entire sidewall profile along the longitudinal direction without having to destroy the wafer to expose the longitudinal section showing the actual profile of the sloped sidewall.

For features with a positively sloped sidewall, measured signal is increased near the edge due to the overlap of the interaction volume and the sidewall. This is called the "edge effect." However, when the sidewall has a negative slope, the edge effect is weakened due to "shadowing" of the feature, as some secondary electrons emerging deeper from the structure are blocked from reaching the detector by the negatively sloped sidewalls. This shadowing makes profiling of 3D features with negative slope particularly challenging. The present disclosure describes charging with a voltage field as a solution to counter the effect of shadowing. Charging may comprise pre-charging the surface of the device before the primary electron beam impinges, or may comprise charging simultaneously with the primary electron beam. When the surface of the semiconductor device is charged, a significant portion of the electrons emitted from the structure can be collected by the detector, resulting in the signal near the edge of the feature to be amplified. The voltage value for pre-charging may be selected based on one or more material properties of the semiconductor device, for example, electrical and thermal conductivity of the semiconductor material. Geometry of the 3D feature (e.g., depth of the feature, target critical dimension of the feature etc.) may also be factored in while selecting the pre-charging voltage. Using a series of SEM images taken sequentially with increasing landing energy, with and without charging voltage field, the sidewall with the negative slope is profiled.

Once presence of a negatively sloped sidewall is detected, the value of the slope is calculated. For that calculation, measured signals obtained during SEM imaging are compared with simulated waveforms. FIGS. 5-16 illustrate such waveforms for varying values of beam energy (also referred to as landing energy (LE) in some figures) and selecting different values of charging voltages. In the simulation results shown, beam energy varied between 1 kV and 10 kV, and charging voltage value was either 0V (i.e. no charging voltage field) or 50V. Persons skilled in the art would understand that these voltage values are for illustrative purposes only and does not limit the scope of the disclosure.

The waveforms are generated by a model that simulates secondary electron yield during SEM imaging with the varying energy values of the electron beam, each waveform corresponding to a respective reference structure with a known negative slope. In the simulations, negative slope values of 0°, 10°, 20° and 30° are used, though any arbitrary slope value may be chosen for the reference structure for simulation. The slope of the simulated waveform that most closely matches with the measured signal is determined to be the slope of the sidewall.

Figure 5:
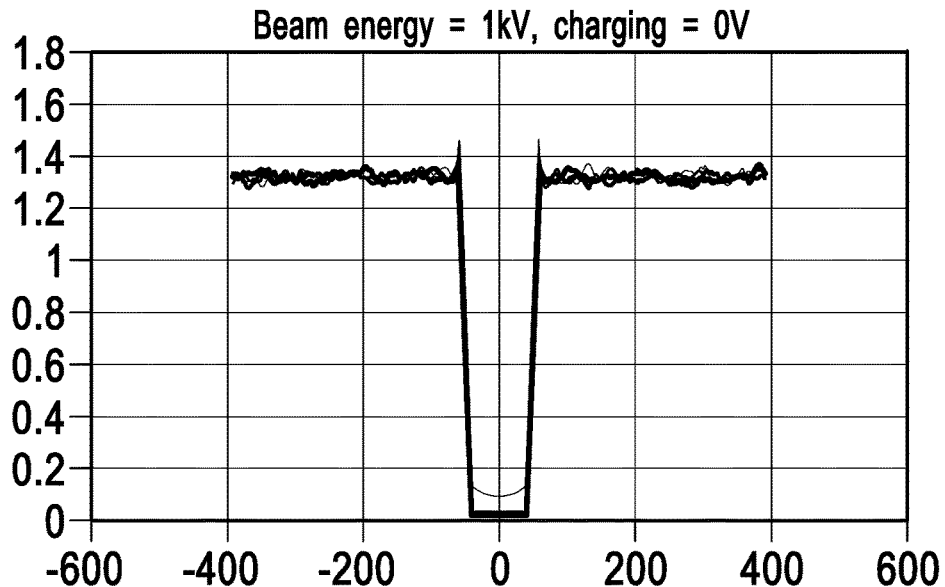
FIG. 5 illustrates simulated waveforms corresponding to beam energy of 1 kV and no charging of the device area for negative slopes of 0°, 10°, 20° and 30°, according to embodiments of the present disclosure.
Figure 6:
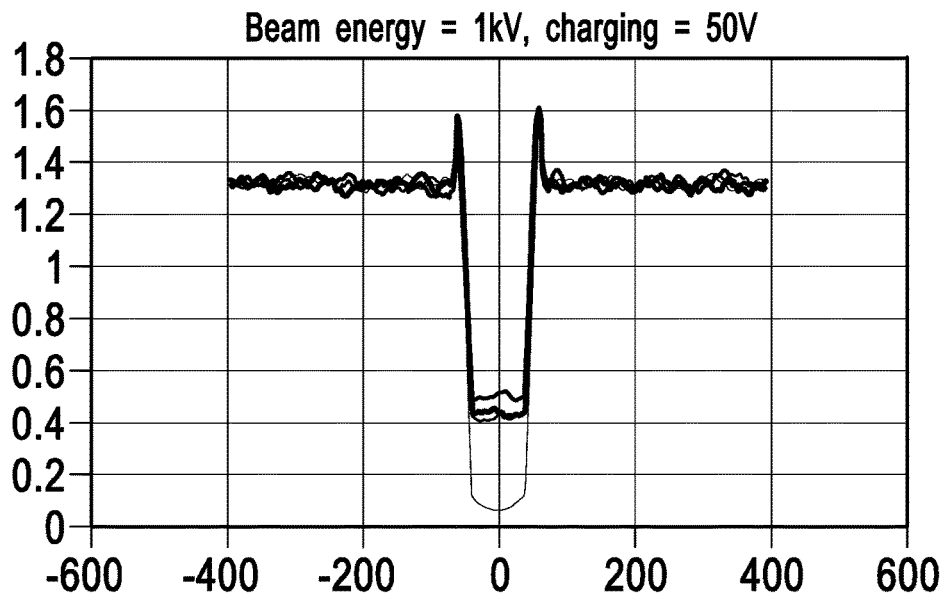
FIG. 6 illustrates simulated waveforms corresponding to beam energy of 1 kV and 50V charging voltage for negative slopes of 0°, 10°, 20° and 30°, according to embodiments of the present disclosure.
Figure 7:
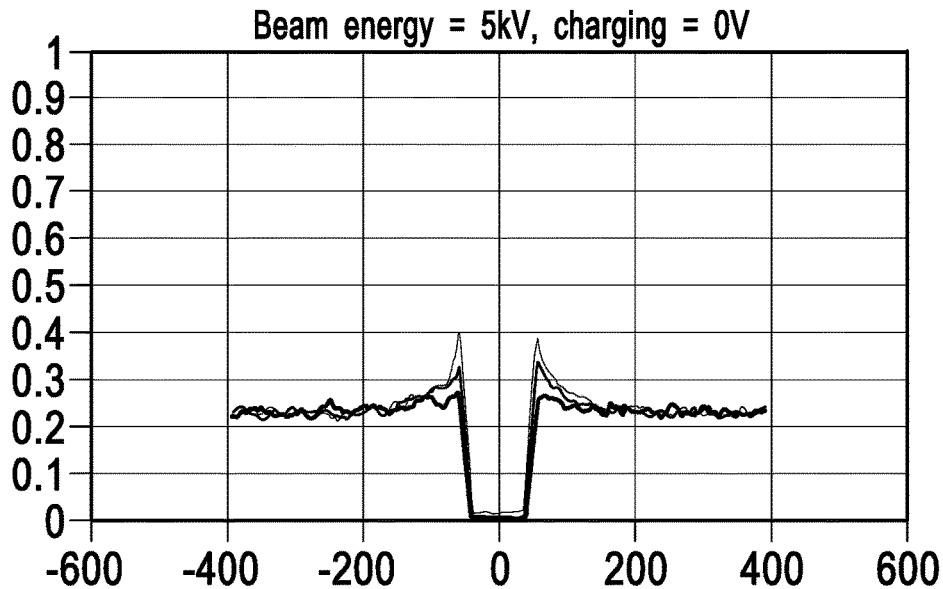
FIG. 7 illustrates simulated waveforms corresponding to beam energy of 5 kV and no charging of the device area for negative slopes of 0°, 10° and 20°, according to embodiments of the present disclosure.
Figure 8:
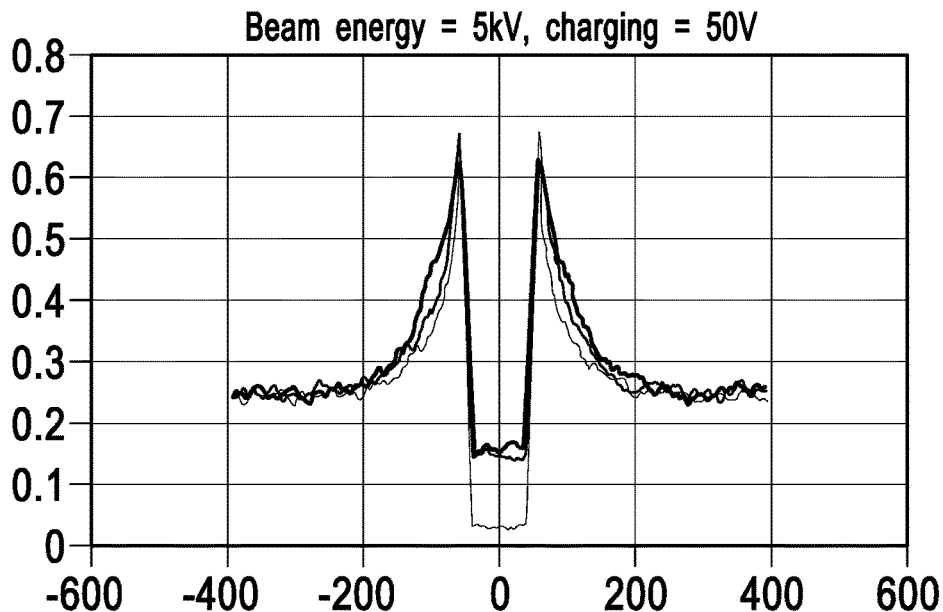
FIG. 8 illustrates simulated waveforms corresponding to beam energy of 5 kV and 50V charging voltage for negative slopes of 0°, 10° and 20°, according to embodiments of the present disclosure.
Figure 9:
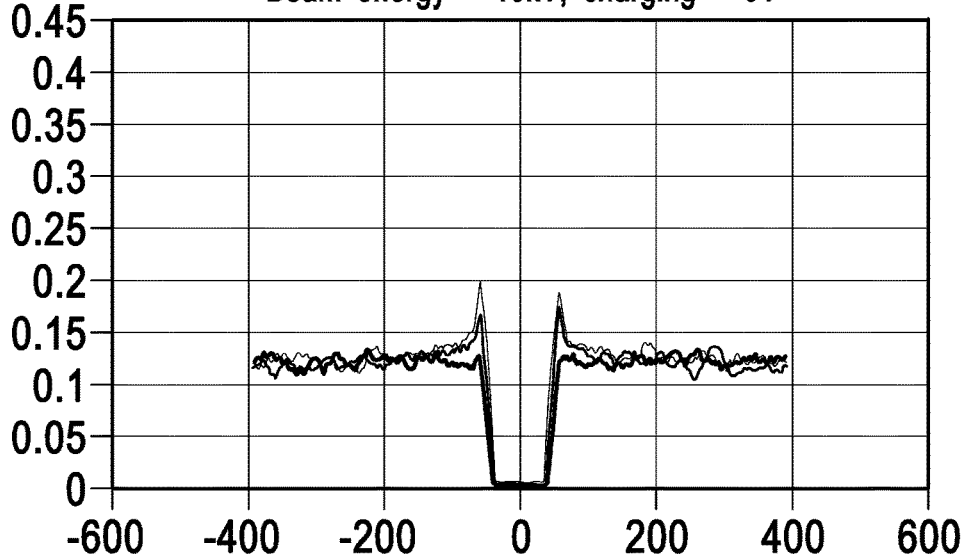
FIG. 9 illustrates simulated waveforms corresponding to beam energy of 10 kV and no charging of the device area for negative slopes of 0°, 10° and 20°, according to embodiments of the present disclosure.
Figure 10:
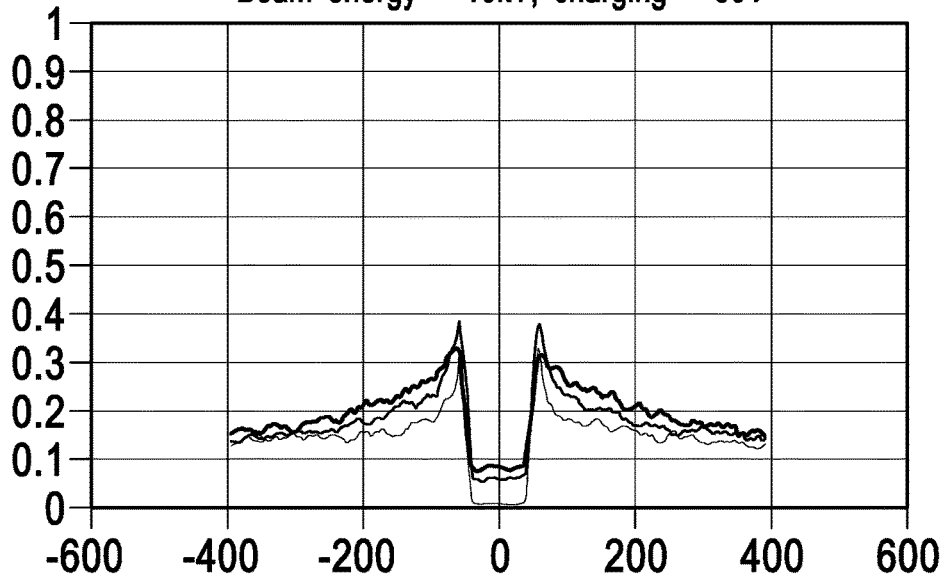
FIG. 10 illustrates simulated waveforms corresponding to beam energy of 10 kV and 50V charging voltage for negative slopes of 0°, 10° and 20°, according to embodiments of the present disclosure.
Figure 11:
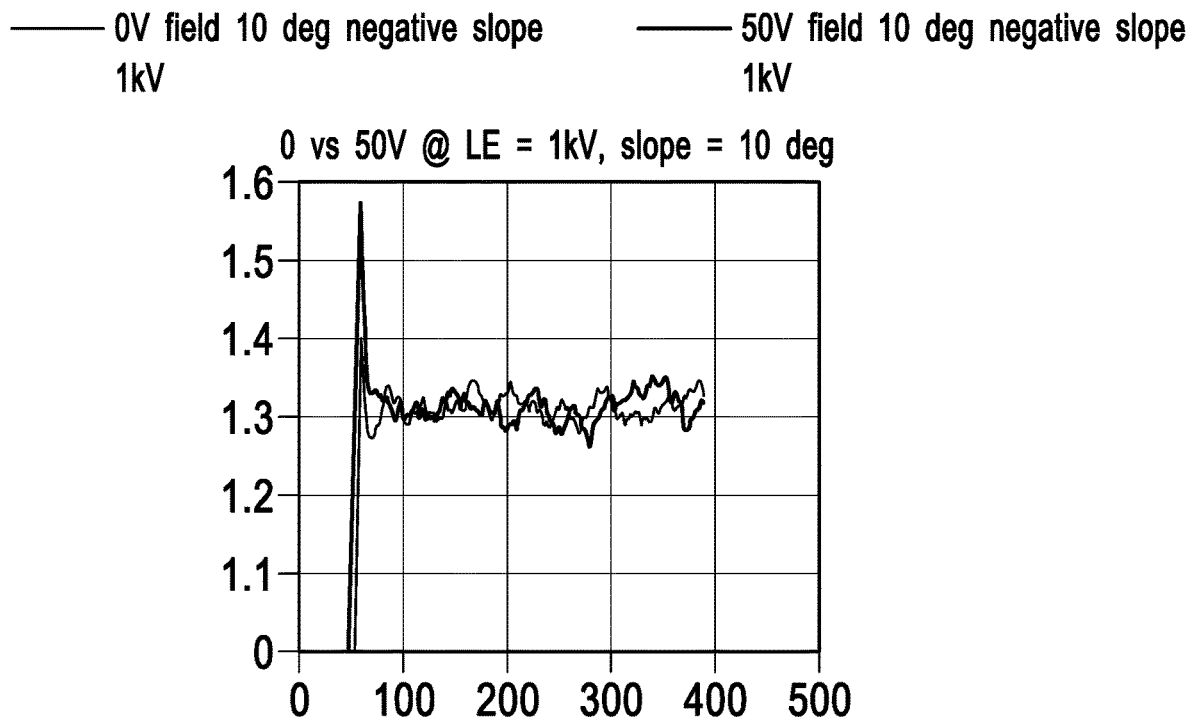
FIG. 11 compares simulated waveforms corresponding to beam energy of 1 kV and negative slope 10° without charging and with 50V charging, according to embodiments of the present disclosure.
Figure 12:
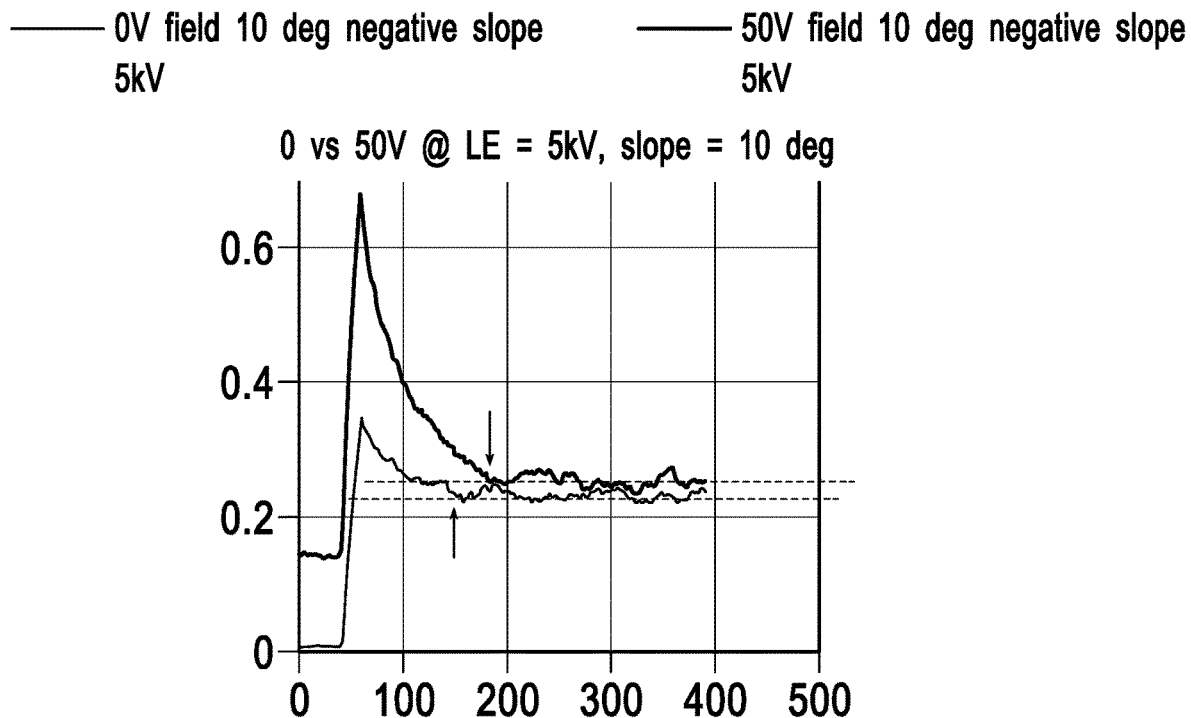
FIG. 12 compares simulated waveforms corresponding to beam energy of 5 kV and negative slope 10° without charging and with 50V charging, according to embodiments of the present disclosure.
Figure 13:
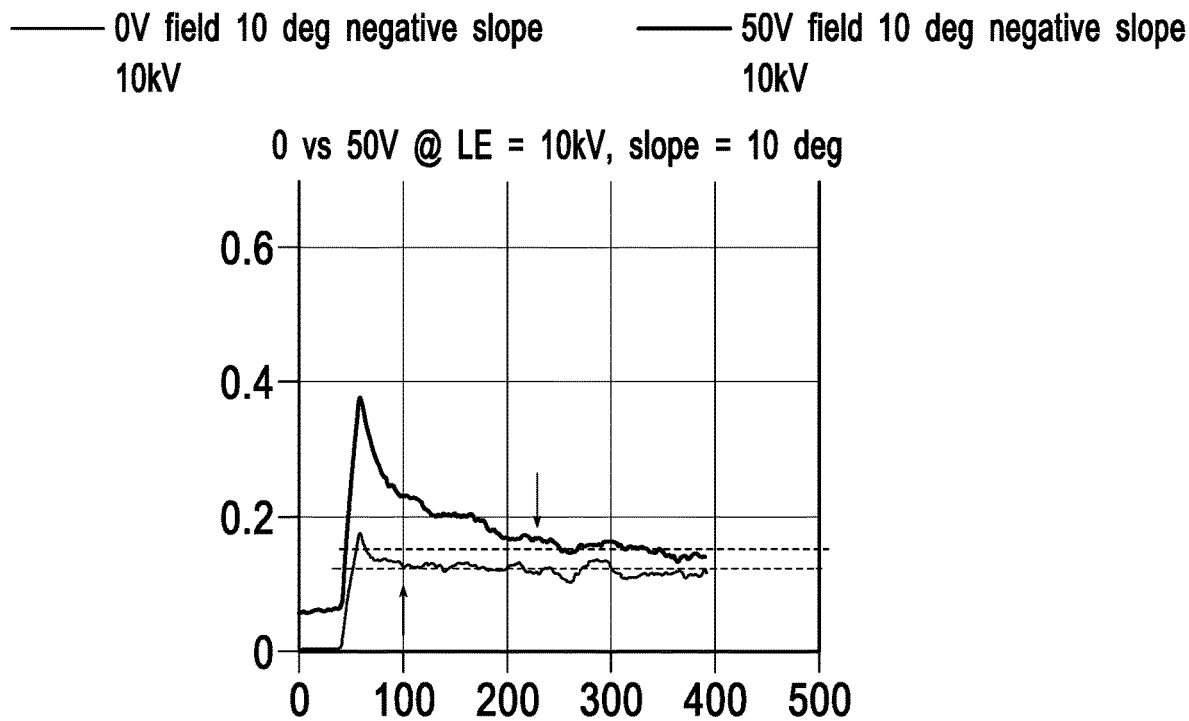
FIG. 13 compares simulated waveforms corresponding to beam energy of 10 kV and negative slope 10° without charging and with 50V charging, according to embodiments of the present disclosure.
Figure 14:
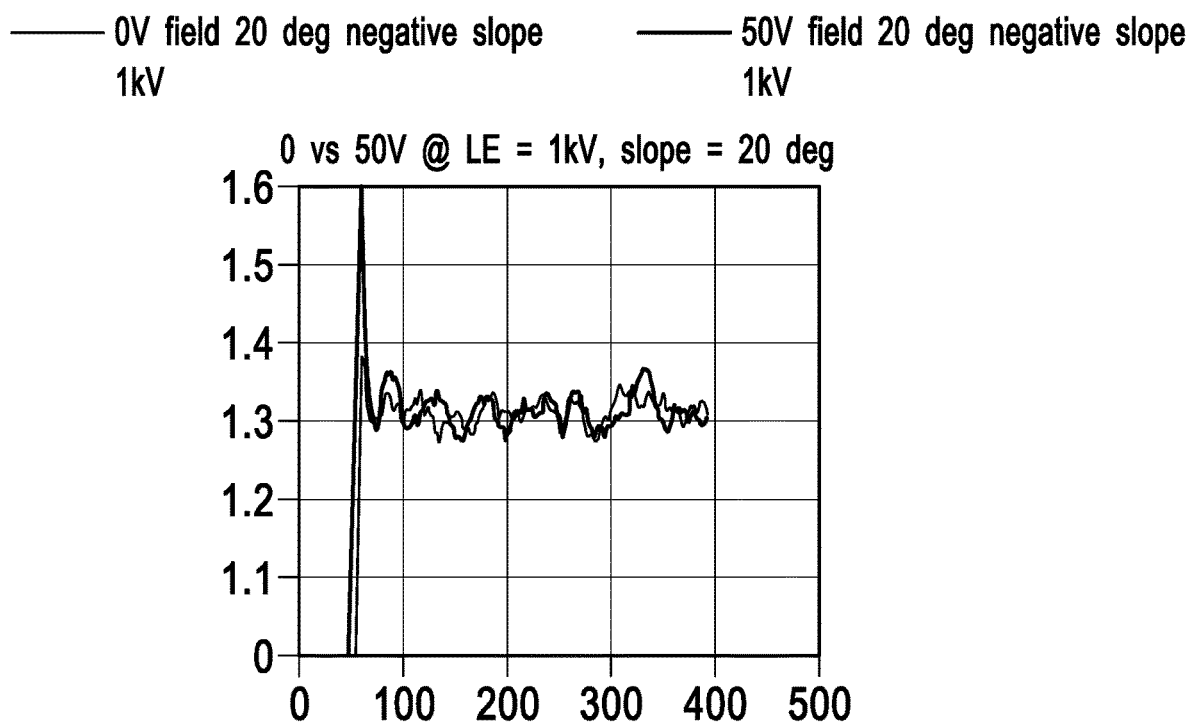
FIG. 14 compares simulated waveforms corresponding to beam energy of 1 kV and negative slope 20° without charging and with 50V charging, according to embodiments of the present disclosure.
Figure 15:
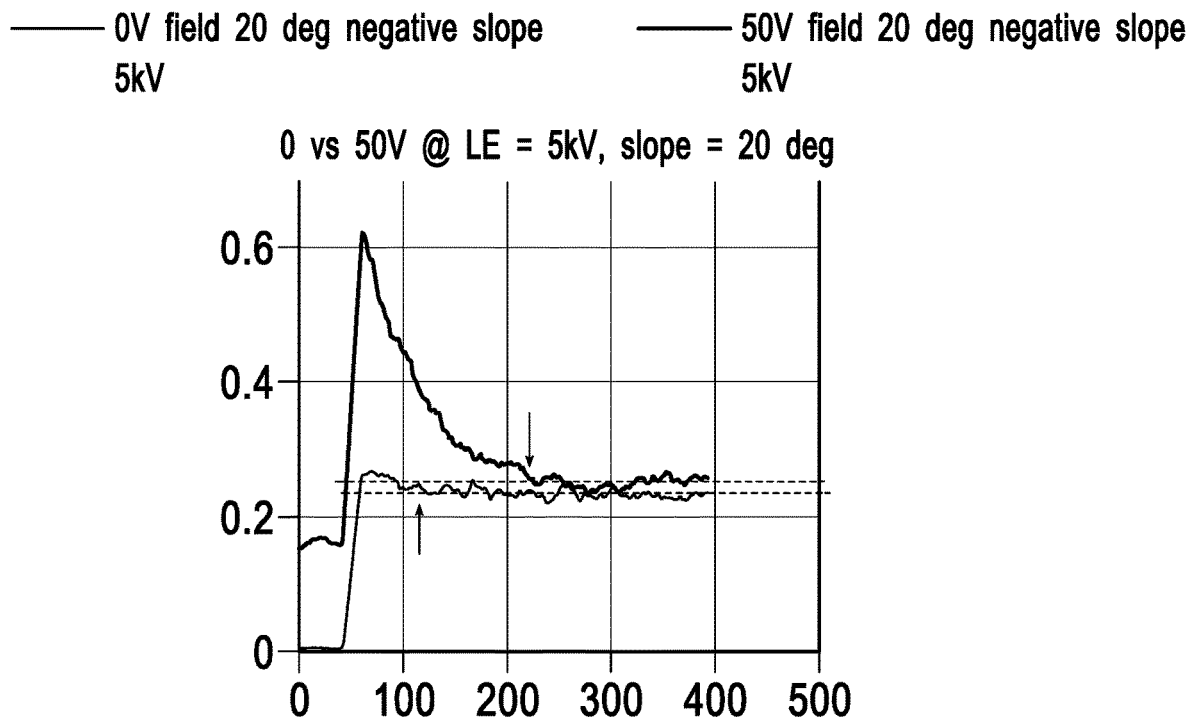
FIG. 15 compares simulated waveforms corresponding to beam energy of 5 kV and negative slope 20° without charging and with 50V charging, according to embodiments of the present disclosure.
Figure 16:
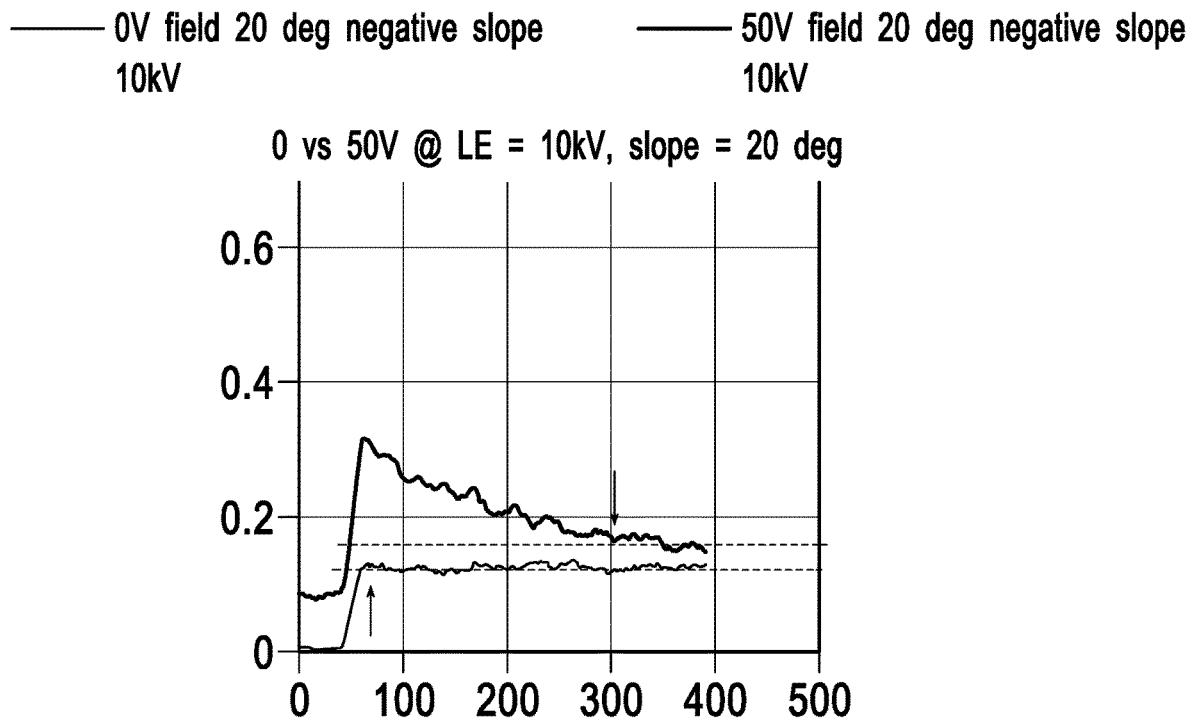
FIG. 16 compares simulated waveforms corresponding to beam energy of 10 kV and negative slope 20° without charging and with 50V charging, according to embodiments of the present disclosure.

FIG. 5 presents simulated waveforms for no charging voltage (indicated as 0V field in the legends for the individual graphs) for 1 kV beam energy (i.e. landing energy of the primary electron beam) corresponding to sidewall slope values of 0°, 10°, 20° and 30°. X-axis of the graphs is the distance from the central axis of the feature, and y-axis represents signal amplitude in arbitrary unit (a.u.). FIG. 6 presents simulated waveforms for 50V charging voltage (indicated as 50V field in the graph legends) for 1 kV landing energy corresponding to those same slope values of 0°, 10°, 20° and 30°. FIG. 7 presents simulated waveforms for no charging voltage (indicated as 0V field in the graph legends) for 5 kV landing energy corresponding to slope values of 0°, 10°, and 20°. FIG. 8 presents simulated waveforms for 50V charging voltage (indicated as 50V field in the graph legends) for 5 kV landing energy corresponding to those same slope values of 0°, 10°, and 20°. FIG. 9 presents simulated waveforms for no charging voltage (indicated as 0V field in the graph legends) for 10 kV landing energy corresponding to slope values of 0°, 10°, and 20°. FIG. 10 presents simulated waveforms for 50V charging voltage (indicated as 50V field in the graph legends) for 5 kV landing energy corresponding to those same slope values of 0°, 10°, and 20°. In each case, charging at 50V has significantly amplified the signal detected at the edge compared to no charging (0V) when all other parameters are kept the same FIGS. 11-16 show zoomed-in versions of the simulated waveforms comparing 0V field (i.e. no charging voltage) and 50V field. FIGS. 11-13 correspond to a sidewall slope of 10° for landing energy values 1 kV, 5 kV and 10 kV respectively, and FIGS. 14-16 correspond to a sidewall slope of 20° for landing energy values 1 kV, 5 kV and 10 kV respectively. The up and down pair of arrows in FIGS. 12-13 and FIGS. 15-16 indicate that the deviation of the signal of the no-charge image will occur at larger distances from the edge when the landing energy is increased. This helps in pinpointing the location of the edge more accurately.

The signal obtained from measurement of the 3D feature requires calibration depending on the material of the semiconductor device as well as the geometry of the feature. Calibration can be done on several ways. One option is to measure a known isolated structure with a known sidewall profile, and correlate the measured signal to the known slope(s) of the sidewall at various depths. This method is known as self-reference imaging. Another option is using simulations using the same material and geometry, and correlating the simulated yield with the beam energy and distance from the edge.

This disclosure allows reconstruction of the 3D profile using SEM images in a non-destructive manner, which is easier to integrate with the manufacturing sequence. Moreover, large-scale device characterization and metrology can be performed across the entire wafer to fine-tune the process without disrupting the manufacturing flow.

Figure 17:
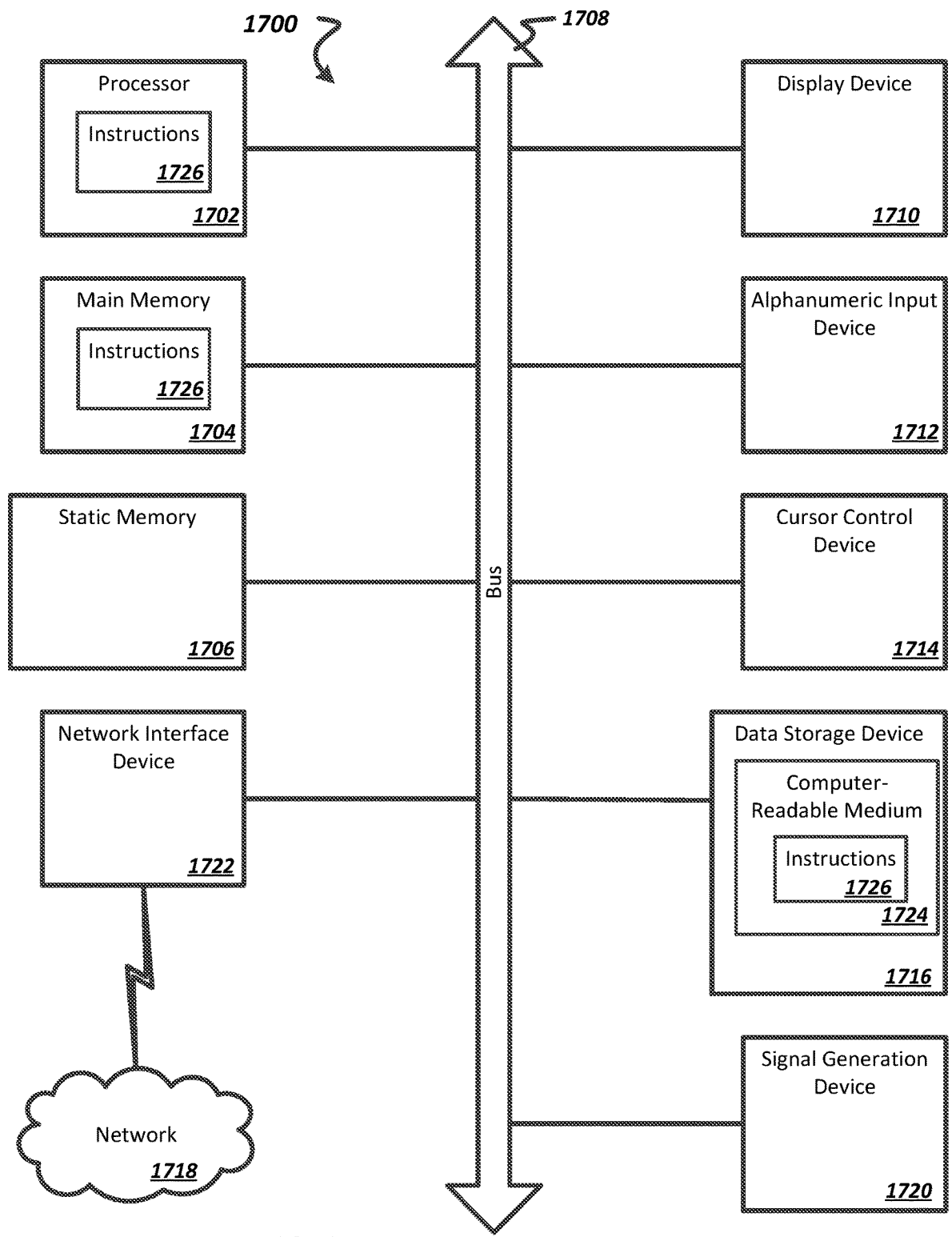
FIG. 17 illustrates an example computer system within which a set of instructions, for causing the machine to perform any one or more of the methodologies discussed herein, may be executed.

FIG. 17 illustrates an example machine of a computer system 1700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1700 includes a processing device 1702, a main memory 1704 (e.g., read-only memory (ROM), flash memory, dynamic random access memory (DRAM) such as synchronous DRAM (SDRAM) etc.), a static memory 1706 (e.g., flash memory, static random access memory (SRAM), etc.), and a data storage device 1716, which communicate with each other via a bus 1708.

Processing device 1702 represents one or more general-purpose processing devices such as a microprocessor, a central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 1702 may also be one or more special-purpose processing devices such as an application specific integrated circuit (ASIC), a field programmable gate array (FPGA), a digital signal processor (DSP), network processor, or the like. The processing device 1702 is configured to execute instructions for performing the operations and steps discussed herein.

The computer system 1700 may further include a network interface device 1722 to communicate over the network 1718. The computer system 1700 also may include a video display unit 1710 (e.g., a liquid crystal display (LCD) or a cathode ray tube (CRT)), an alphanumeric input device 1712 (e.g., a keyboard), a cursor control device 1714 (e.g., a mouse or a touch pad),), a signal generation device 1720 (e.g., a speaker), a graphics processing unit (not shown), video processing unit (not shown), and audio processing unit (not shown).

The data storage device 1716 may include a machine-readable storage medium 1724 (also known as a computer-readable medium) on which is stored one or more sets of instructions or software embodying any one or more of the methodologies or functions described herein. The instructions may also reside, completely or at least partially, within the main memory 1704 and/or within the processing device 1702 during execution thereof by the computer system 1700, the main memory 1704 and the processing device 1702 also constituting machine-readable storage media.

In one implementation, the instructions include instructions to implement functionality corresponding to a height difference determination. While the machine-readable storage medium 1724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "obtaining" or "associating" or "executing" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

What is claimed is:

1. A method comprising:
   selecting an area of a semiconductor device to be scanned by an electron beam of a scanning electron microscope (SEM), wherein the area includes a three-dimensional (3D) feature having a top opening and a sidewall;
   imaging the 3D feature while varying an energy value of the electron beam, wherein the electron beam impinges at a first point within the selected area of the semiconductor device and interacts with the sidewall, wherein the first point is at a distance away from an edge of the 3D feature; and
   determining, based on change in a signal representing secondary electron yield at the edge as the energy value of the electron beam is varied during the SEM imaging, whether the sidewall is occluded from a line-of-sight of the electron beam.

2. The method of claim 1, further comprising:
   responsive to determining that the sidewall is occluded from the light-of-sight of the electron beam, determining a slope of the sidewall.

3. The method of claim 2, wherein determining the slope of the sidewall further comprises:
   generating a plurality of waveforms by a model that simulates secondary electron yield during SEM imaging with the varying energy values of the electron beam, each waveform corresponding to a respective reference structure with a known negative slope;
   comparing the signal obtained during the SEM imaging with the waveforms generated by the model for the varying energy values;
   selecting the waveform that matches most closely with the signal obtained during the SEM imaging; and
   determining that the negative slope associated with the selected waveform to be the slope of the sidewall of the 3D feature.

4. The method of claim 3, further comprising:
   charging the selected area of the semiconductor device to amplify the signal obtained during the SEM imaging near the edge of the 3D feature.

5. The method of claim 4, wherein the charging further comprises:

selecting a voltage value for charging the selected area of the semiconductor device based on one or more material properties of the semiconductor device.

6. The method of claim 5, wherein selecting the voltage value further comprises:
considering a target geometry of the 3D feature.

7. The method of claim 3, further comprising:
varying the distance between the first point where the electron beam impinges and the edge of the top opening.

8. The method of claim 3, wherein the method further comprises:
calibrating the signal by correlating with simulated secondary electron yield for the varying energy values.

9. The method of claim 3, further comprising:
reconstructing a 3D profile of the 3D feature using the determined negative slope of the sidewall.

10. The method of claim 1, further comprising:
integrating the SEM imaging and slope determination operations in-line with other processing steps in a manufacturing sequence of a wafer containing the semiconductor device.

11. The method of claim 1, wherein the 3D feature has a lateral dimension in a range varying from a few nanometers to tens or hundreds of nanometers.

12. A non-transitory machine-readable storage medium storing instructions which, when executed, cause a processing device to perform operations comprising:
selecting an area of a semiconductor device to be scanned by an electron beam of a scanning electron microscope (SEM), wherein the area includes a three-dimensional (3D) feature having a top opening and a sidewall;
imaging the 3D feature while varying an energy value of the electron beam, wherein the electron beam impinges at a first point within the selected area of the semiconductor device and interacts with the sidewall, wherein the first point is at a distance away from an edge of the 3D feature; and
determining, based on change in a signal representing secondary electron yield at the edge as the energy value of the electron beam is varied during the SEM imaging, whether the sidewall is occluded from a line-of-sight of the electron beam.

13. The non-transitory machine-readable storage medium of claim 12, wherein the operations further comprise:
responsive to determining that the sidewall is occluded from the light-of-sight of the electron beam, determining a slope of the sidewall.

14. The non-transitory machine-readable storage medium of claim 13, wherein determining the slope of the sidewall further comprises:
generating a plurality of waveforms by a model that simulates secondary electron yield during SEM imaging with the varying energy values of the electron beam, each waveform corresponding to a respective reference structure with a known negative slope;
comparing the signal obtained during the SEM imaging with the waveforms generated by the model for the varying energy values;
selecting the waveform that matches most closely with the signal obtained during the SEM imaging; and
determining that the negative slope associated with the selected waveform to be the slope of the sidewall of the 3D feature.

15. The non-transitory machine-readable storage medium of claim 14, wherein the operations further comprise:
charging the selected area of the semiconductor device to amplify the signal obtained during the SEM imaging near the edge.

16. The non-transitory machine-readable storage medium of claim 15, wherein the charging further comprises:
selecting a voltage value for charging the selected area of the semiconductor device based on one or more material properties of the semiconductor device.

17. The non-transitory machine-readable storage medium of claim 16, wherein selecting the voltage value further comprises:
considering a target geometry of the 3D feature.

18. The non-transitory machine-readable storage medium of claim 14, wherein the operations further comprise:
varying the distance between the first point where the electron beam impinges and the edge of the top opening.

19. The non-transitory machine-readable storage medium of claim 14, wherein the operations further comprise:
calibrating the signal by correlating with simulated secondary electron yield for the varying energy values.

20. The non-transitory machine-readable storage medium of claim 14, wherein the operations further comprise:
reconstructing a 3D profile of the 3D feature using the determined negative slope of the sidewall.

* * * * *